United States Patent
Gehl et al.

(10) Patent No.: US 11,554,952 B2
(45) Date of Patent: Jan. 17, 2023

(54) METHOD FOR CLOSING OPENINGS IN A FLEXIBLE DIAPHRAGM OF A MEMS ELEMENT

(71) Applicant: Robert Bosch GmbH, Stuttgart (DE)

(72) Inventors: Bernhard Gehl, Wannweil (DE); Christoph Hermes, Kirchentellinsfurt (DE); Juergen Butz, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 238 days.

(21) Appl. No.: 16/961,876

(22) PCT Filed: Dec. 20, 2018

(86) PCT No.: PCT/EP2018/086119
§ 371 (c)(1),
(2) Date: Aug. 25, 2020

(87) PCT Pub. No.: WO2019/149426
PCT Pub. Date: Aug. 8, 2019

(65) Prior Publication Data
US 2021/0229983 A1    Jul. 29, 2021

(30) Foreign Application Priority Data
Jan. 30, 2018 (DE) .................... 10 2018 201 358.6

(51) Int. Cl.
*B81C 1/00*    (2006.01)
*B81B 3/00*    (2006.01)

(52) U.S. Cl.
CPC ........ *B81C 1/00158* (2013.01); *B81B 3/0005* (2013.01); *B81B 3/0021* (2013.01); *B81B 2201/0257* (2013.01); *B81B 2201/0264* (2013.01); *B81B 2203/0127* (2013.01); *B81C 2201/0197* (2013.01)

(58) Field of Classification Search
CPC ........ B81C 1/00158; B81C 2201/0197; B81B 3/0005; B81B 3/0021; B81B 2201/0257; B81B 2201/0264; B81B 2203/0127
See application file for complete search history.

(56) References Cited

U.S. PATENT DOCUMENTS 9,013,012 B2 *    4/2015    Shankar ................ B81B 7/0041
                                                         257/415
2001/0024711 A1    9/2001    Werner et al.
2009/0174148 A1    7/2009    Bischof et al.
(Continued)

FOREIGN PATENT DOCUMENTS

DE    102015224506 A1    6/2017
DE    102015224520 A1    6/2017

OTHER PUBLICATIONS

International Search Report dated Mar. 14, 2019 in connection with International Application No. PCT/EP2018/086119.

*Primary Examiner* — Yasser A Abdelaziez
(74) *Attorney, Agent, or Firm* — Norton Rose Fulbright US LLP; Gerard Messina (57) ABSTRACT

A method for closing openings in a flexible diaphragm of a MEMS element. The method includes: providing at least one opening in the flexible diaphragm, situating sealing material in the area of the at least one opening, melting-on at least the applied sealing material in the area of the at least one opening, and subsequently cooling the melted-on material to close the at least one opening.

12 Claims, 6 Drawing Sheets

(56) References Cited

U.S. PATENT DOCUMENTS

| | | |
|---|---|---|
| 2010/0190301 A1 | 7/2010 | Delapierre et al. |
| 2014/0042603 A1* | 2/2014 | Hosseini ................. H01L 24/83 |
| | | 257/772 |
| 2016/0060104 A1* | 3/2016 | Chu .................... B81C 1/00309 |
| | | 257/419 |
| 2016/0304338 A1* | 10/2016 | Saint-Patrice ...... B81C 1/00277 |

* cited by examiner

METHOD FOR CLOSING OPENINGS IN A FLEXIBLE DIAPHRAGM OF A MEMS ELEMENT

FIELD

The present invention relates to a method for closing openings in a flexible diaphragm of a MEMS element.

The present invention furthermore relates to a MEMS element including a flexible diaphragm, which includes at least one opening.

Although the present invention is generally applicable to any MEMS element including a flexible diaphragm, the present invention is explained with reference to MEMS sensors in the form of MEMS microphones or MEMS pressure sensors having defined internal pressure between an upper and a lower diaphragm.

BACKGROUND INFORMATION

In conventional MEMS sensors, for example, MEMS pressure sensors or MEMS microphones, at least one cavity is formed, which is covered by at least one flexible diaphragm. A pressure-dependent, in particular a sound-pressure-dependent deflection change of the flexible diaphragm is detected by capacitance changes which occur, for example, due to electrodes between flexible diaphragm and a fixed electrode surface, and may be read out. During the manufacturing of the MEMS pressure sensor, among other things, etching accesses are required in the diaphragm to expose the diaphragm in order to be able to expose this diaphragm as a whole. These openings have to be closed again to provide the defined internal pressure.

A method for manufacturing a micromechanical component including a substrate and a cap, which is connected to the substrate and encloses a first cavity with the substrate, is described in German Patent Application No. DE 10 2015 224 520 A1, an access opening through a material area of the substrate or the cap, which enters a liquid phase in one method step, between a first plane, which extends in parallel to a main extension plane of the substrate and is situated on a side facing away from the first cavity of an area of the access opening formed essentially perpendicular to the main extension plane, and a second plane, which is situated on a side facing toward the first cavity of the area of the access opening formed essentially perpendicular to the main extension plane, is filled essentially completely.

A method for manufacturing a micromechanical component including a substrate and a cap, which is connected to the substrate and encloses a first cavity with the substrate, is described in DE 10 2015 224 506 A1, a first pressure prevailing in the first cavity and a first gas mixture having a first chemical composition being enclosed,
  in a first method step, an access opening connecting the first cavity to surroundings of the micromechanical component being formed in the substrate or in the cap,
  in a second method step, the first pressure and/or the first chemical composition being set in the first cavity,
  in a third method step, the access opening being closed by introducing energy or heat into an absorbing part of the substrate or the cap with the aid of a laser, a getter introduced into the first cavity before the third method step being at least partially activated during the third method step with the aid of laser radiation generated by the laser.

SUMMARY

In one specific embodiment, the present invention provides a method for closing openings in a flexible diaphragm of a MEMS element, including the steps
  providing at least one opening in the flexible diaphragm,
  situating sealing material in the area of the at least one opening,
  melting-on at least the applied sealing material in the area of the at least one opening and subsequently cooling the melted-on material to close the at least one opening.

In another specific embodiment, the present invention provides a MEMS element, including a flexible diaphragm, which includes at least one opening which is closed by melting-on an applied sealing material in the area of the at least one opening and subsequently cooling the melted-on sealing material.

One of the advantages thus achieved is that the closure of a flexible diaphragm of a MEMS element at a defined internal pressure is thus enabled. Another advantage is that the opening is less restricted with respect to its geometrical design and nonetheless a reliable closure is enabled. Another advantage is that upon the closing of the opening, fewer particles may enter a cavity possibly defined by the flexible diaphragm. In addition, openings may be closed reliably and cost-effectively in a flexible manner.

Further features, advantages, and further specific embodiments of the present invention are described hereinafter or are based on the description below.

According to one advantageous refinement of the present invention, the application of the sealing material is carried out with the aid of spin coating and/or with the aid of an inkjet method and/or with the aid of bonding on a wafer, in particular in the area of the at least one opening. One of the advantages thus achieved is that, for example, laser-sensitive material, for example, silicon dioxide, a metal, a polymer or the like may thus be applied in the form of a paste, emulsion, emulsion drops, or the like in a flexible manner.

According to a further advantageous refinement of the present invention, the melting-on is carried out with the aid of a laser beam. The advantage thereof is that the melting-on may be locally limited in a simple and simultaneously extremely reliable manner and the closure of the at least one opening may thus be carried out reliably.

According to a further advantageous refinement of the present invention, in addition to the melting-on of the applied sealing material, material of the flexible diaphragm is melted-on in the area of the at least one opening. The advantage thereof is that a particularly reliable connection of sealing material and diaphragm material may thus takes place in the area of the at least one opening.

According to a further advantageous refinement of the present invention, the sealing material is moved with the aid of a laser beam into the area of the at least one opening. The sealing material may thus also initially be situated outside the direct area of the openings and then moved with the aid of the laser beam to the opening to close it. A complex and accurate arrangement of sealing material directly in the area of the at least one opening is thus not necessary.

According to a further advantageous refinement of the present invention, the sealing material is at least partially provided in the form of diaphragm material. The advantage thereof is that no further type of material has to be applied as sealing material. In this way, a particularly reliable closure is achieved using a single material.

According to a further advantageous refinement of the present invention, the sealing material is provided by removal of diaphragm material of the flexible diaphragm. The flexible diaphragm may already be dimensioned in preparation for the removal in such a way, in particular thicker, that a desired (target) layer thickness of the flexible diaphragm is subsequently achieved by the corresponding removal. The closing and the suitable dimensioning of the flexible diagram may thus essentially take place in one step.

According to a further advantageous refinement of the present invention, the laser beam is provided in the form of a hollow ring or a hollow ellipse with the aid of an optical device. In this way, particularly accurate and reliable melting-on of the sealing material and closing of the at least one opening may be carried out by shaping of the laser beam, in particular its cross-sectional area. With the aid of a hollow ring, for example, the transition area between sealing material and opening may be deliberately irradiated without a large introduction of energy into the center of the sealing material or the opening. The sealing material is thus melted-on only in the edge area and complete melting of the sealing material is avoided.

According to a further advantageous refinement of the present invention, the laser beam is provided pulsed in its power and/or in at least one diameter. The flexibility is thus increased, since the laser beam may thus be adapted flexibly to different materials and openings of different sizes.

According to a further advantageous refinement of the present invention, the laser beam and the plane of the flexible diaphragm are situated tilted with respect to one another. The advantage thereof is that, for example, an increased spot size of the laser beam may be achieved with less penetration depth into the flexible diaphragm, which optimizes the introduction of energy by the laser beam in the desired even material depth of the flexible diaphragm and enlarges the melting-on area at the same time.

According to a further advantageous refinement of the present invention, a cavity is formed at least partially with the aid of the flexible diaphragm and the at least one opening is formed as an access to the cavity and a defined pressure is enclosed in the cavity by closing the at least one opening in the flexible diaphragm. The advantage thereof is that a precise and reliable MEMS element is provided for pressure applications.

According to a further advantageous refinement of the MEMS element in accordance with the present invention, anti-adhesive material is situated below the flexible diaphragm, in particular on an inner surface of a cavity. The advantage thereof is that permanent adhesion of parts within the cavity is reduced.

Further important features and advantages of the present invention result from the figures and the description herein.

It shall be understood that the above-mentioned features and the features still to be explained hereinafter are usable not only in the particular specified combination, but rather also in other combinations or alone, without departing from the scope of the present invention.

Preferred designs and specific embodiments of the present invention are shown in the figures and are explained in greater detail below, identical reference numerals referring to identical or similar or functionally identical components or elements.

DETAILED DESCRIPTION OF EXAMPLE EMBODIMENTS

Figure 1:
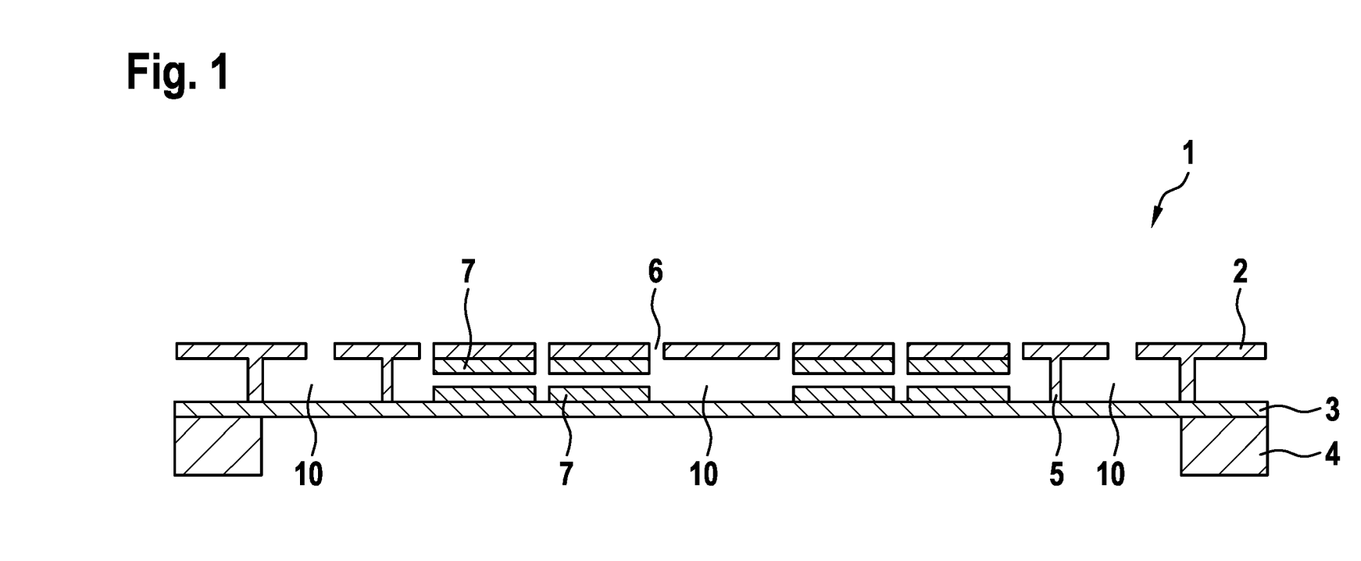
FIG. 1 schematically shows in cross section a MEMS pressure sensor according to one specific example embodiment of the present invention prior to the closing of openings.

FIG. 1 schematically shows in cross section a MEMS pressure sensor according to one specific embodiment of the present invention prior to the closing of openings.

A MEMS pressure sensor 1 is shown in FIG. 1. MEMS pressure sensor 1 includes a substrate 4, a lower diaphragm 3 being situated on substrate 4, which is or may be partially exposed from substrate 4 on its lower side. Support structures 5, which support an upper diaphragm 2 in relation to lower diaphragm 3, are situated on the upper side of lower diaphragm 4. Upper diaphragm 2 and lower diaphragm 3 are situated essentially horizontally and in parallel to one another. Multiple cavities 10 are formed by lower and upper diaphragm 2, 3 and support structure 5. Electrodes 7 are situated in each case on the upper side of lower diaphragm 3 and on the lower side of upper diaphragm 2, which, upon movement of diaphragms 2, 3, experience a change of the capacitance between them. This capacitance change may be read out accordingly with the aid of a readout method and, for example, a pressure on diaphragms 2, 3 may be ascertained.

To manufacture this MEMS layer structure for MEMS pressure sensor 1, etching accesses 6 in the form of openings are situated in upper diaphragm 2. These openings 6 have to be closed again, for example, to enable a defined internal pressure in cavities 10 between the two diaphragms 2, 3 of, for example, 1 to 10 mbar.

Figure 2:
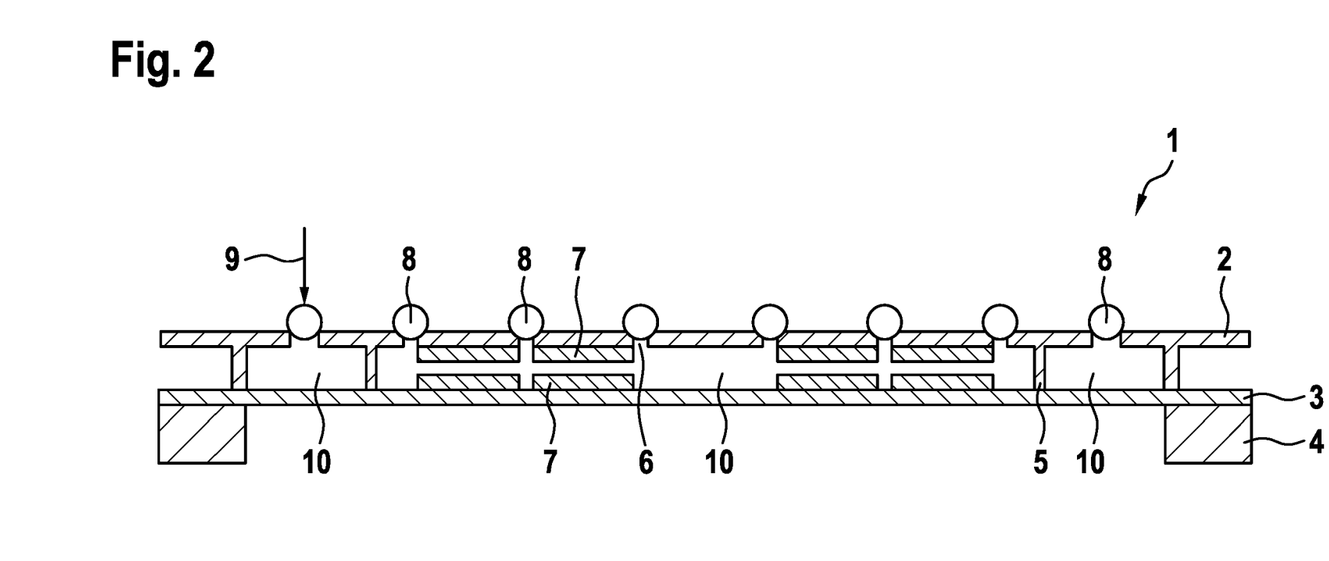
FIG. 2 schematically shows in cross section the MEMS pressure sensor according to FIG. 1 during the closing of openings.

FIG. 2 schematically shows in cross section the MEMS pressure sensor according to FIG. 1 during the closing of openings.

MEMS pressure sensor 1 according to FIG. 1 is essentially shown in FIG. 2. In contrast to MEMS microphone 1 according to FIG. 1, in MEMS microphone 1 according to FIG. 2, sealing material 8 is now situated partially in or on openings 6. Sealing material 8 is intentionally melted-on on or in the openings with the aid of a laser beam 9 and these openings are thus closed after cooling. Sealing material 8 is, for example, an appropriately matched laser-sensitive material, for example, silicon dioxide, a metal, a polymer, or the like in the form of a paste, emulsion, emulsion drops, or the like. It may be applied, for example, with the aid of spin coating or deliberately via inkjet methods. An additionally bonded-on additional wafer may possibly also be used as sealing material 8.

Figure 3:
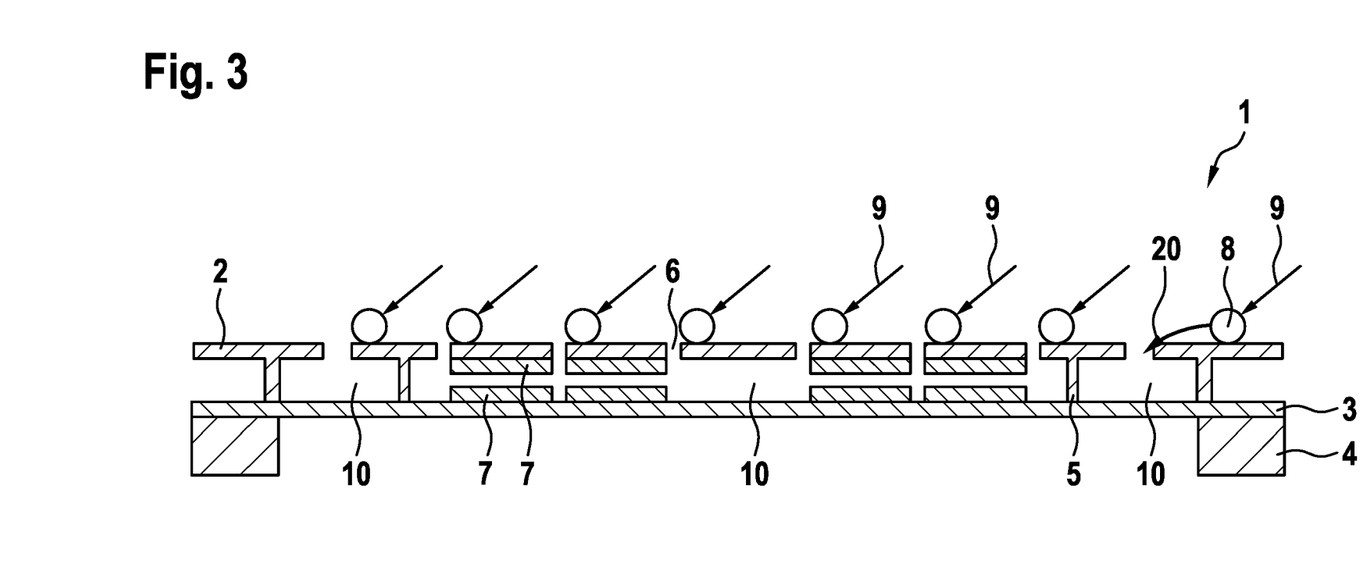
FIG. 3 schematically shows in cross section steps of a method for closing openings of the MEMS pressure sensor of FIG. 1 according to one specific example embodiment of the present invention.

FIG. 3 schematically shows in cross section steps of a method for closing openings of a MEMS pressure sensor of FIG. 1 according to one specific embodiment of the present invention.

MEMS pressure sensor 1 according to FIG. 1 is essentially shown in FIG. 3. In contrast to MEMS pressure sensor 1 according to FIG. 1, in MEMS pressure sensor 1 according to FIG. 3, sealing material 8 is not situated directly in or on openings 6, but rather in each case adjacent to the right. With the aid of an obliquely incident laser beam 9, sealing material 8 is moved by laser beam 9 toward opening 6 (reference numeral 20), so that finally sealing material 8 is situated on or in opening 6 according to FIG. 2. Subsequently, it is again heated with the aid of laser beam 9, thereby melted-on, and thus closes opening 6 after the cooling.

Figure 4:
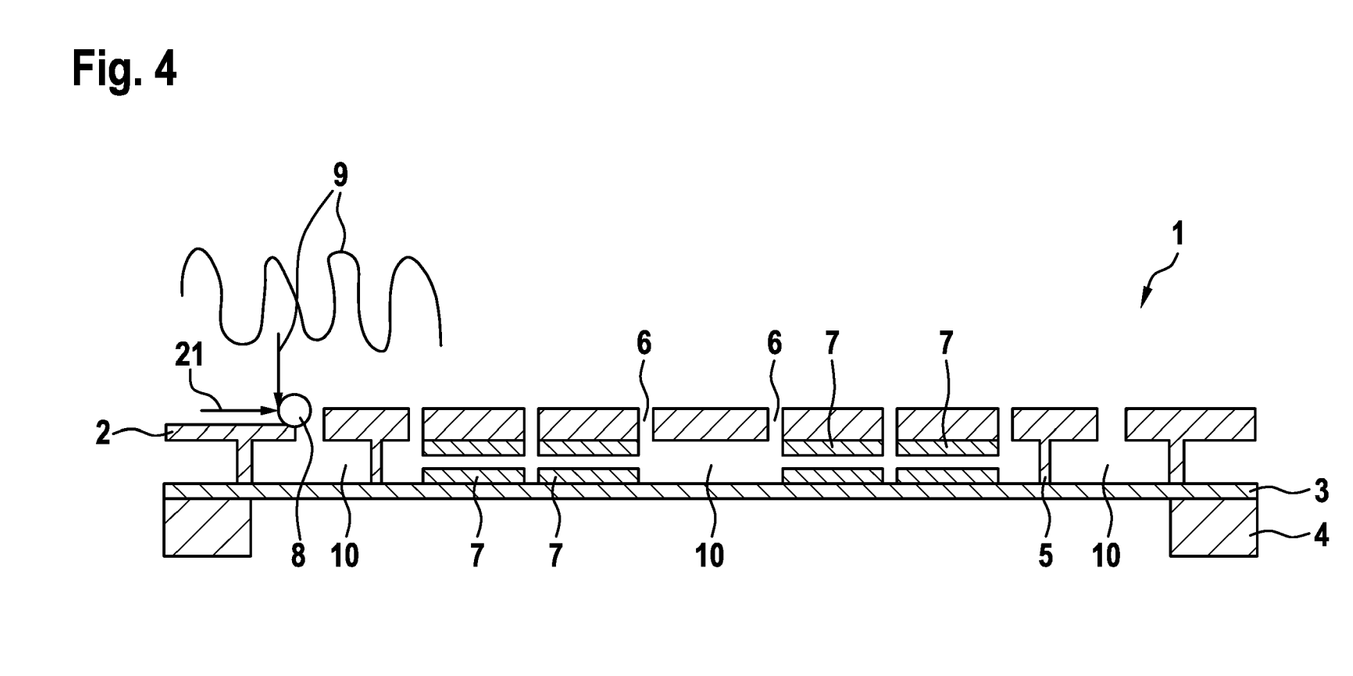
FIG. 4 shows steps of a method for closing openings of a MEMS pressure sensor according to one specific example embodiment of the present invention.

FIG. 4 shows steps of a method for closing openings of a MEMS microphone according to one specific embodiment of the present invention. MEMS pressure sensor 1 according to FIG. 1 is essentially shown in FIG. 4. In contrast to MEMS pressure sensor 1 according to FIG. 1, in MEMS pressure sensor 1 according to FIG. 4, upper diaphragm 2 is now designed to be thicker. The thickness of upper diaphragm 2, measured perpendicular to the distance between the two diaphragms 2, 3, is dimensioned in such a way so as to be able to generate a material front from melted-on diaphragm material as sealing material 8 with the aid of a laser beam 9, but without destroying diaphragm 2. Laser beam 9 is guided on and over upper diaphragm 2 in such a way that the movement of the material front takes place in direction 21, i.e., the melted-on material is moved in the direction of an opening 6. Laser beam 9 scans over the diaphragm surface of upper diaphragm 2. In other words, the thickness of upper diaphragm 2 is thus dimensioned in such a way that after the material removal with the aid of laser beam 9 and closing of openings 6, the desired target thickness of upper diaphragm 2 is achieved or provided.

FIGS. 5a through 5d show various shapes of the laser beam for closing openings of a MEMS pressure sensor according to specific embodiments of the present invention.

Figure 5A:
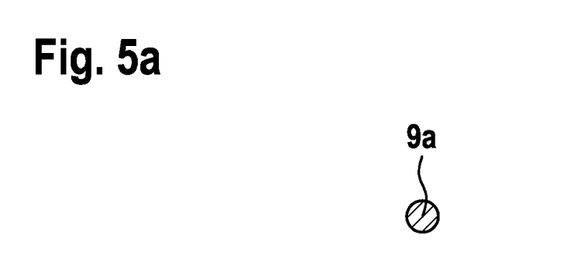
FIGS. 5*a* through 5*d* show various shapes of the laser beam for closing openings of a MEMS pressure sensor according to specific embodiments of the present invention.
Figure 5B:
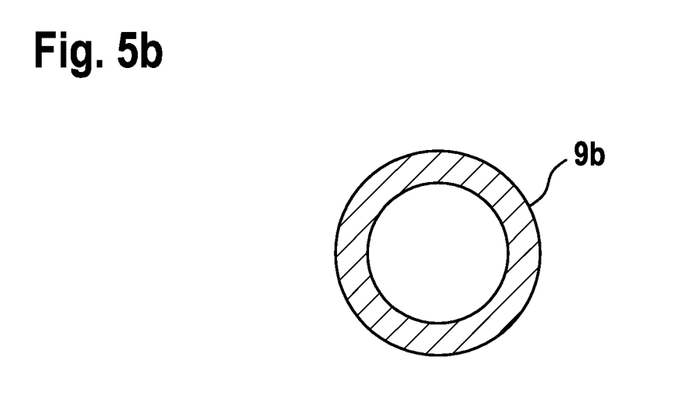
Figure 5C:
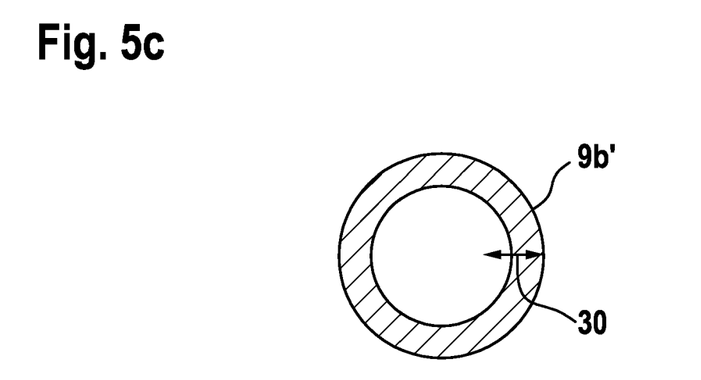
Figure 5D:
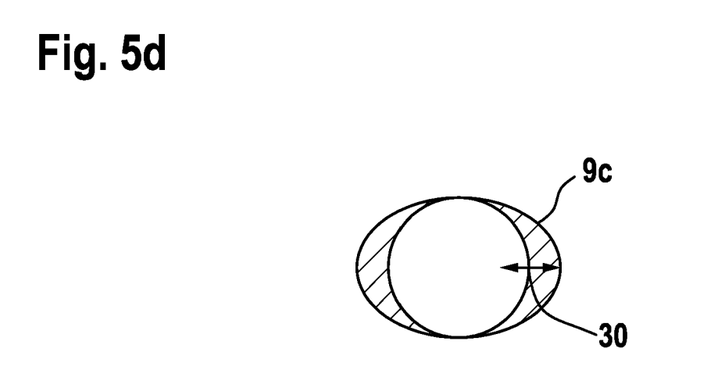

FIGS. 5a through 5d each show variations of the shape of a laser beam 9. In FIG. 5a, laser beam 9 has the shape of a punctiform laser spot 9 or a circle. In FIG. 5b, laser beam 9 is provided in its cross-sectional area in the form of a hollow ring 9b with the aid of a corresponding optical unit. In FIG. 5c, hollow ring 9b according to FIG. 5b is essentially provided. Diameter 30 of hollow ring 9b' according to FIG. 5c varies, however, for example, periodically, randomly, or the like, in particular around an average diameter. The average diameter essentially corresponds in particular to the diameter of a round opening 6 of upper diaphragm 2. Finally, a hollow ellipse 9c is shown in FIG. 5d, whose one diameter 30 pulses or varies along an axis of the hollow ellipse. It is also alternatively or additionally possible to correspondingly vary the diameter of the other axis.

For example, better local distributions of melt-on sealing material 8 may be generated with the aid of the specific embodiments of FIGS. 5b through 5d.

In another specific embodiment, laser beam 9 may be irradiated onto the surface of the MEMS element, in particular onto upper flexible diaphragm 2, at a corresponding angle to achieve a larger spot size, in other words, a larger area to which laser beam 9 is to be applied with lesser penetration depth into diaphragm 2. The introduction of energy into a desired even material depth may thus be optimized and the melted-on area may be enlarged.

The MEMS element may be used in particular as a MEMS pressure sensor, a MEMS inertial sensor, a combination of MEMS inertial sensor and MEMS pressure sensor, a MEMS microphone, a MEMS loudspeaker, and/or as a MEMS gas sensor having a reference gas enclosed in a cavity, for example, in the form of an NOx sensor or a lambda sensor or the like.

A sensor element including a flexible diaphragm has, for example, a thickness in the range of approximately several hundred nanometers to several micrometers. For example, silicon-rich nitride $Si_xN_y$ or stoichiometric silicon nitride $Si_3N_4$ having a thickness in the range of approximately several hundred nanometers to several micrometers may be used as the sealing material. Furthermore, as already mentioned, silicon dioxide in spin-on glass or a metal paste having dissolved tungsten oxide may be used as the sealing material, the solvent subsequently being evaporated and the silicon dioxide or metal being used as sealing material 8. If sealing material 8 is able to be applied with the aid of an inkjet method, aluminum or copper may be thereby applied, for example. Sealing material 8 may also be applied to diaphragm 2 with the aid of LIFT (laser induced forward transfer). Chromium, aluminum, copper, selenium dioxide, or graphene may then be used as the sealing material, for example.

In summary, at least one of the specific embodiments of the present invention has at least one of the following advantages:

Less particle introduction into the area of the lower side of the diaphragm upon closing of an opening therein.

Freer geometry selection in the openings, in particular the etching accesses.

Possibility of subsequent coating with the aid of an anti-adhesive material, for example, a cavity below the diaphragm and subsequent closure at a defined internal pressure.

Enclosing multiple internal pressures in various cavity areas formed by the diaphragm.

High level of flexibility.

High level of reliability.

Although the present invention was described on the basis of preferred exemplary embodiments, it is not restricted thereto, but rather is modifiable in manifold ways.

What is claimed is:

1. A method for closing openings in a flexible diaphragm of a MEMS element, comprising the following steps:
   providing at least one opening in the flexible diaphragm;
   applying sealing material in an area of the at least one opening; and
   melting-on at least the applied sealing material in the area of the at least one opening and subsequently cooling the melted-on sealing material to close the at least one opening, wherein in addition to the melting-on of the applied sealing material, material of the flexible diaphragm is melted-on in the area of the at least one opening.

2. The method as recited in claim 1, wherein the application of the sealing material is carried out: (i) using spin coating in the area of the at least one opening, and/or (ii) using an inkjet method in the area of the at least one opening, and/or (iii) by bonding on a wafer.

3. The method as recited in claim 1, wherein the melting-on takes place using a laser beam.

4. A method for closing openings in a flexible diaphragm of a MEMS element, comprising the following steps:
   providing at least one opening in the flexible diaphragm;
   applying sealing material in an area of the at least one opening; and
   melting-on at least the applied sealing material in the area of the at least one opening and subsequently cooling the melted-on sealing material to close the at least one opening, wherein the sealing material is moved into the area of the at least one opening using a laser beam.

5. A method for closing openings in a flexible diaphragm of a MEMS element, comprising the following steps:
providing at least one opening in the flexible diaphragm;
applying sealing material in an area of the at least one opening; and
melting-on at least the applied sealing material in the area of the at least one opening and subsequently cooling the melted-on sealing material to close the at least one opening, wherein the sealing material is at least partially provided in the form of diaphragm material.

6. The method as recited in claim 5, wherein the sealing material is provided by removing diaphragm material of the flexible diaphragm.

7. A method for closing openings in a flexible diaphragm of a MEMS element, comprising the following steps:
providing at least one opening in the flexible diaphragm;
applying sealing material in an area of the at least one opening; and
melting-on at least the applied sealing material in the area of the at least one opening and subsequently cooling the melted-on sealing material to close the at least one opening, wherein the melting-on takes place using a laser beam, and wherein the laser beam is provided in the form of a hollow ring or a hollow ellipse, using an optical device.

8. A method for closing openings in a flexible diaphragm of a MEMS element, comprising the following steps:
providing at least one opening in the flexible diaphragm;
applying sealing material in an area of the at least one opening; and
melting-on at least the applied sealing material in the area of the at least one opening and subsequently cooling the melted-on sealing material to close the at least one opening, wherein the melting-on takes place using a laser beam, and wherein the laser beam is provided pulsed in its power and/or in at least one diameter.

9. A method for closing openings in a flexible diaphragm of a MEMS element, comprising the following steps:
providing at least one opening in the flexible diaphragm;
applying sealing material in an area of the at least one opening; and
melting-on at least the applied sealing material in the area of the at least one opening and subsequently cooling the melted-on sealing material to close the at least one opening, wherein the melting-on takes place using a laser beam, and wherein the laser beam and a plane of the flexible diaphragm are situated tilted with respect to one another.

10. The method as recited in claim 1, wherein a cavity is formed at least partially using the flexible diaphragm and the at least one opening is formed as an access to the cavity and a defined pressure is enclosed in the cavity by the closing of the at least one opening.

11. A MEMS element including a flexible diaphragm, the flexible diaphragm including at least one opening, which is closed by melting-on an applied sealing material in an area of the at least one opening and subsequently cooling the melted-on sealing material, wherein in addition to the melting-on of the applied sealing material, material of the flexible diaphragm is melted-on in the area of the at least one opening.

12. The MEMS element as recited in claim 11, wherein anti-adhesive material is situated below the flexible diaphragm on an internal surface of a cavity of the MEMS element.

\* \* \* \* \*